(12) United States Patent
Rao et al.

(10) Patent No.: US 12,483,247 B2
(45) Date of Patent: Nov. 25, 2025

(54) LEVEL SHIFTER CIRCUIT

(71) Applicant: Texas Instruments Incorporated, Dallas, TX (US)

(72) Inventors: Yuan Rao, Allen, TX (US); Sreeram Nasum S, Bangalore (IN); Anthony Calabria, McKinney, TX (US); Tarunvir Singh, Bangalore (IN); Ajith Kumar Narayanasetty, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 67 days.

(21) Appl. No.: 18/621,244

(22) Filed: Mar. 29, 2024

(65) Prior Publication Data

US 2025/0247097 A1    Jul. 31, 2025

Related U.S. Application Data

(60) Provisional application No. 63/626,213, filed on Jan. 29, 2024.

(51) Int. Cl.
*H03K 19/0185* (2006.01)
(52) U.S. Cl.
CPC .......... *H03K 19/018521* (2013.01); *H03K 19/018528* (2013.01)
(58) Field of Classification Search
CPC ................... H03K 19/018507–018528
See application file for complete search history.

(56) References Cited

U.S. PATENT DOCUMENTS

| | | | |
|---|---|---|---|
| 2007/0222478 A1* | 9/2007 | Chen | H03K 19/018528 326/80 |
| 2014/0169038 A1* | 6/2014 | Kamath | H03D 3/00 363/16 |
| 2014/0340136 A1* | 11/2014 | Teplechuk | H03K 3/356182 327/333 |
| 2023/0042591 A1* | 2/2023 | Radfar | H03K 19/018507 |

* cited by examiner

*Primary Examiner* — Patrick O Neill
(74) *Attorney, Agent, or Firm* — Mandy Barsilai Fernandez; Frank D. Cimino

(57) ABSTRACT

A circuit includes a semiconductor substrate, a first ground terminal, a second ground terminal, a driver circuit, a capacitor, a receiver circuit, and a substrate bias circuit. The driver circuit is on the semiconductor substrate. The driver circuit is coupled to the first ground terminal, and has a first output and a second output. The capacitor has a first terminal coupled to the first output of the driver circuit and a second terminal. The receiver circuit is on the semiconductor substrate. The receiver circuit is coupled to the second ground terminal, and has a first input coupled to the second terminal of the capacitor, and a second input coupled to the second output of the driver circuit. The substrate bias circuit has a first input coupled to the first ground terminal, a second input coupled to the second ground terminal, and an output coupled to the semiconductor substrate.

20 Claims, 5 Drawing Sheets

FIG. 2

LEVEL SHIFTER CIRCUIT

CROSS-REFERENCE TO RELATED APPLICATIONS

This application claims priority to U.S. Provisional Application No. 63/626,213, filed Jan. 29, 2024, entitled "Voltage Level Shifters with GND Shift Tolerance," which is hereby incorporated by reference.

BACKGROUND

Electronic systems often have circuits that are powered by different power supply voltages, or that require different signal levels to activate circuit components. In such systems level shifter circuits (level shifters) are used to translate signals from one voltage level to another. For example, a level shifter may be used to translate a signal from a lower voltage to a higher voltage, or to translate a signal from a higher voltage to a lower voltage.

SUMMARY

In one example, a circuit includes a semiconductor substrate, a first ground terminal, a second ground terminal, a driver circuit, a capacitor, a receiver circuit, and a substrate bias circuit. The driver circuit is on the semiconductor substrate. The driver circuit is coupled to the first ground terminal, and has a first output and a second output. The capacitor has a first terminal coupled to the first output of the driver circuit and a second terminal. The receiver circuit is on the semiconductor substrate. The receiver circuit is coupled to the second ground terminal, and has a first input coupled to the second terminal of the capacitor, and a second input coupled to the second output of the driver circuit. The substrate bias circuit has a first input coupled to the first ground terminal, a second input coupled to the second ground terminal, and an output coupled to the semiconductor substrate.

In another example, a circuit includes a semiconductor substrate, a first ground terminal, a second ground terminal, a driver circuit, a receiver circuit, a first capacitor, a second capacitor, and a substrate bias circuit. The driver circuit is coupled to the first ground terminal. The driver circuit includes a transmitter having a first output and a second output. The receiver circuit is coupled to the second ground terminal. The receiver circuit includes a pulse receiver having a first input and a second input. The first capacitor has a first terminal coupled to the first output of the transmitter and a second terminal coupled to the first input of the pulse receiver. The second capacitor has a first terminal coupled to the second output of the transmitter and a second terminal coupled to the second input of the pulse receiver. The substrate bias circuit has a first input coupled to the first ground terminal, a second input coupled to the second ground terminal, and an output coupled to the semiconductor substrate.

In a further example, a system includes a first ground terminal, a second ground terminal, a first circuit, a second circuit, and a level shifter integrated circuit. The first circuit is coupled to a first ground terminal. The first circuit has an output for providing an output signal. The second circuit is coupled to the second ground terminal. The second circuit has an input. The level shifter integrated circuit has an input coupled to the output of the first circuit, and an output coupled to the input of the second circuit. The level shifter integrated circuit includes a semiconductor substrate, a driver circuit, a capacitor, a receiver circuit, and a substrate bias circuit. The driver circuit is on the semiconductor substrate. The driver circuit is coupled to the first ground terminal, and has an input coupled to the input of the level shifter integrated circuit, a first output and a second output. The capacitor has a first terminal coupled to the first output of the driver circuit and a second terminal. The receiver circuit is on the semiconductor substrate. The receiver circuit is coupled to the second ground terminal, and has a first input coupled to the second terminal of the capacitor, a second input coupled to the second output of the driver circuit, and an output coupled to the output of the level shifter integrated circuit. The substrate bias circuit has a first input coupled to the first ground terminal, a second input coupled to the second ground terminal, and an output coupled to the semiconductor substrate.

DETAILED DESCRIPTION

Figure 1:
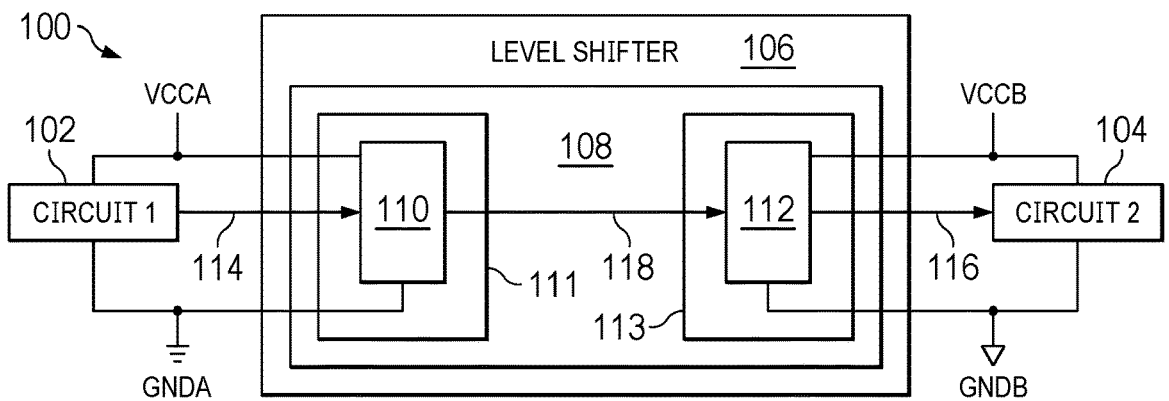
FIG. 1 is a block diagram of an example system that includes circuits operating with different ground that communicate via a level shifter.

FIG. 1 is a block diagram of a system 100 that includes circuits operating with different grounds. The system 100 includes a circuit 102, a circuit 104, and a level shifter 106. The circuit 102 is coupled to a first power terminal (VCCA) and a first reference terminal (GNDA). The circuit 104 is coupled to a second power terminal (VCCB) and a second reference terminal (GNDB). A voltage at GNDA may be different than a voltage at GNDB. Similarly, the voltage between VCCA and GNDA may be different than the voltage between VCCB and GNDB. The circuit 102 has an output terminal and provides an output signal 114. That circuit 102 may be any circuit that provides an output signal. For example, the circuit 102 may be a processor, such as a microcontroller, and the output signal 114 may be any signal provided by the processor (e.g., a serial communication signal). The circuit 104 has an input terminal for receipt of a signal 116 provided by the level shifter 106. The signal 116 may be the output signal 114 shifted to the voltages provided at VCCB and GNDB. The circuit 104 may be any circuit that communicates with the circuit 102 via the output signal 114. For example, the circuit 104 may be an audio amplifier, or any other circuit, controlled by the circuit 102.

The level shifter 106 receives the output signal 114, and generates the signal 116 by shifting the output signal 114 from the voltage at VCCA and GNDA to the voltage at VCCB and GNDB. The level shifter 106 is an integrated circuit that includes a die 108. The die 108 includes a driver circuit 110 and a receiver circuit 112. The driver circuit 110 is coupled to VCCA and GNDA. The receiver circuit 112 is coupled to VCCB and GNDB. Accordingly, the driver circuit 110 is in a first ground domain 111 of the die 108 and the receiver circuit 112 is in a second ground domain 113 of the die 108. A ground domain is an area of the die in which the circuits are coupled to a given ground terminal. For example, the circuits of the first ground domain 111 are coupled to GNDA, and the circuits of the second ground domain 113 are coupled to GNDB. The different ground domains may be isolated from one another by an insolation structure (such as an isolation trench filled with an insulator, such as an oxide). The driver circuit 110 receives the output signal 114 and generates an output signal 118 that is provided to the receiver circuit 112 across the ground domains of the driver circuit 110 and receiver circuit 112.

Level shifter circuits generally shift signals across VCC domains, but not across GND domains. Such level shifter circuits cannot provide ground level translation or accommodate any difference (e.g., DC shift or AC bounce) in the grounds of circuits coupled to the inputs and outputs of the level shifter circuit. Isolator circuits constructed as multi-chip modules can provide transfer of signals across ground domains, but the need for multiple dies makes such circuits complex and costly. The level shifter 106 provides transfer of signals across ground domains, while tolerating DC or AC voltage difference between the grounds, using a single die to reduce circuit complexity and cost.

Figure 2:
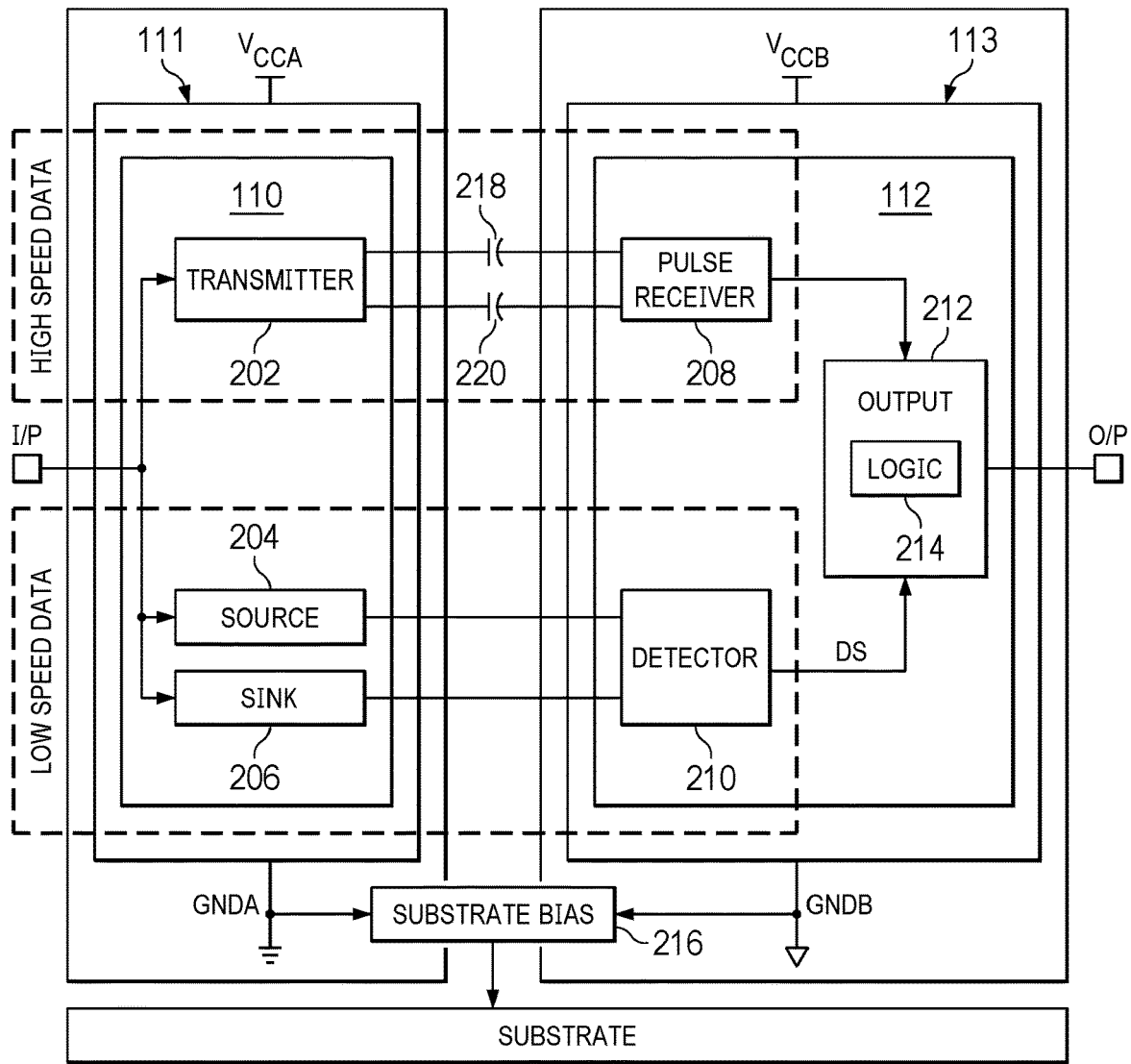
FIG. 2 is a block diagram of an example of the level shifter of FIG. 1.

FIG. 2 is a block diagram of an example of the level shifter 106. The level shifter 106 includes the driver circuit 110, the receiver circuit 112, a substrate bias circuit 216, capacitors 218 and 220. The driver circuit 110 and the receiver circuit 112 are provided on a single semiconductor substrate 226 (e.g., a silicon substrate). The driver circuit 110 is coupled to VCCA and GNDA. The receiver circuit 112 is coupled to VCCB and GNDB. The driver circuit 110 has an input terminal (I/P) for receiving an input signal to be level shifted. The driver circuit 110 includes a transmitter 202, a source circuit 204, and a sink circuit 206. The receiver circuit 112 has an output terminal (O/P) for providing a level-shifted signal. The receiver circuit 112 includes a pulse receiver 208, a detector 210, and an output circuit 212.

The transmitter 202, the capacitor 218, the capacitor 220, and the pulse receiver 208 are coupled in a high-speed data circuit that transfers edges of an input signal received at I/P from the driver circuit 110 to the receiver circuit 112. The transmitter 202 has differential outputs that are coupled to differential inputs of the pulse receiver 208 through the capacitors 218 and 220. The transmitter 202 provides a digital signal at the differential outputs. The capacitors 218 and 220 block DC of the digital signal, and pass pulses at the edges of the digital signal. The polarity of the pulses is a function of edge direction. A rising edge of the digital signal produces a positive polarity pulse at an input of the pulse receiver 208, and a falling edge of the digital signal produces a negative polarity pulse at an input of the pulse receiver 208. The pulse receiver 208 receives and amplifies the pulses passed by the capacitors 218 and 220. The pulse receiver 208 includes a differential amplifier having differential inputs coupled to the capacitors 218 and 220. The pulse receiver 208 may include multiple differential amplifiers coupled in series in some implementations. An output of the differential amplifier(s) provides the output of the pulse receiver 208.

An input of the output circuit 212 is coupled to the output of the pulse receiver 208. The output circuit 212 includes a logic circuit 214. The logic circuit 214 generates a digital signal representing the input signal received at I/P responsive to the pulses received from the pulse receiver 208. For example, the logic circuit 214 generates a rising edge of the digital signal (to generate a logic high on the digital signal) responsive to a positive polarity pulse received from the pulse receiver 208, and generates a falling edge of the digital signal (to generate a logic low on the digital signal) responsive to a negative polarity pulse received from the pulse receiver 208. The output circuit 212 may provide the digital signal using the voltage at VCCB to level shift the signal relative to the voltage at VCCA. The output circuit 212 may include a driver coupled to an output of the logic circuit 214 to drive the digital signal to O/P.

The source circuit 204, the sink circuit 206, and the detector 210 are coupled in a low-speed data circuit that transfers a DC representation of the input signal received at I/P from the driver circuit 110 to the receiver circuit 112. The source circuit 204 provides a source signal (sources a current) to the detector 210 if GNDA is at a higher voltage than GNDB. The sink circuit 206 provides a sink signal (draws a current from) the detector 210 if GNDA is at a lower voltage than GNDB. When the input signal received at I/P is a logic high, the source circuit 204 will source current to the detector 210, or the sink circuit 206 will sink current from the detector 210. When the input signal at I/P is a logic low, the source circuit 204 does not source current to the detector 210, and the sink circuit 206 does not sink current from the detector 210. Accordingly, a logic high is transferred by sourcing or sinking current, and a logic low is transferred by not sourcing or sinking current. The detector 210 has an output, at which the detector 210 provides a detector signal (DS) that represents the input signal at I/P. The output of the detector 210 is coupled to an input of the output circuit 212 and an input of the logic circuit 214.

Because the transmitter 202 and the pulse receiver 208 are capacitively coupled in the high-speed data circuit, noise at the inputs of the pulse receiver 208 may produce pulses that set the digital signal generated by the logic circuit 214 to an incorrect state. The logic circuit 214 has an override input coupled to the output of the detector 210. The logic circuit 214 applies the detector signal, which is DC signal and less likely to be corrupted by noise, to correct the state of the digital signal. For example, if within a selected time (e.g., 1 microsecond) after a transition in the digital signal, the state of the digital signal is different from the state of the detector signal, the logic circuit 214 may change the state of the digital signal to match the state of the detector signal.

The substrate bias circuit 216 provides a bias voltage to the semiconductor substrate 226 to reduce the likelihood of damage to the integrated circuit including the level shifter 106 due to excessive voltage between the semiconductor substrate 226 and the circuit layers. The substrate bias circuit 216 is coupled to GNDA and GNDB, and may drive the semiconductor substrate 226 to the lower of the voltage (ground voltage) on GNDA and the voltage on GNDB. Additional information regarding the operation of the substrate bias circuit 216 is provided with reference to FIG. 4.

Figure 3:
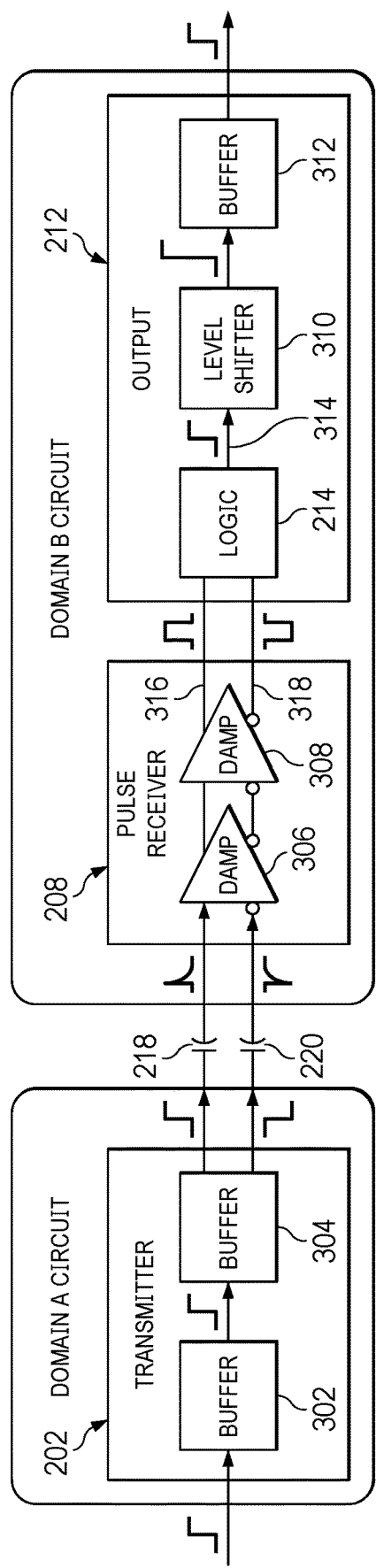
FIG. 3 is a block diagram of a portion of the level shifter of FIG. 2 including an example high-speed signal circuit.

FIG. 3 is a block diagram of a portion of the level shifter 106 including an example high-speed signal circuit. The transmitter 202 includes a buffer 302 and a buffer 304. An input of the buffer 302 is coupled to the I/P. An output of the buffer 302 is coupled to an input of the buffer 304. A first output of the buffer 304 is coupled to a first terminal of the capacitor 218, and a second output of the buffer 304 is coupled to a first terminal of the capacitor 220. The pulse receiver 208 includes a differential amplifier 306 and a differential amplifier 308 coupled in series. The differential amplifier 306 and the differential amplifier 308 amplify the pulses received from the capacitors 218 and 220. The differential amplifier 306 and the differential amplifier 308 have differential inputs and outputs. A first input of the differential amplifier 306 is coupled to a second terminal of the capacitor 218, and a second terminal of the differential amplifier 306 is coupled to a second terminal of the capacitor 220. A first output of the differential amplifier 306 is coupled to a first input of the differential amplifier 308, and a second output of the differential amplifier 306 is coupled to a second input of the differential amplifier 308.

The differential amplifier 308 is coupled to the logic circuit 214. A first output of the differential amplifier 308 is coupled to a first input of the logic circuit 214, and a second output of the differential amplifier 308 is coupled to a second input of the logic circuit 214. A signal 316 is provided at the first output of the differential amplifier 308, and a signal 318 is provided at the second output of the differential amplifier 308. The logic circuit 214 changes the state of the receiver out signal 314 responsive to the pulses received from the differential amplifier 308. For example, a pulse may be provided by the signal 316 to set the digital signal generated by the logic circuit 214 to a logic high, and a pulse may be provided by the signal 318 to set the digital signal generated by the logic circuit 214 to a logic low.

The output of the logic circuit 214 is coupled to an input of the level shifter 310. The level shifter 310 adjusts the voltage of the receiver out signal 314. The output of the level shifter 310 is coupled to an input of the buffer 312. The buffer 312 drives the level-shifted receiver out signal 314 to circuitry external to the level shifter 106.

Figure 4:
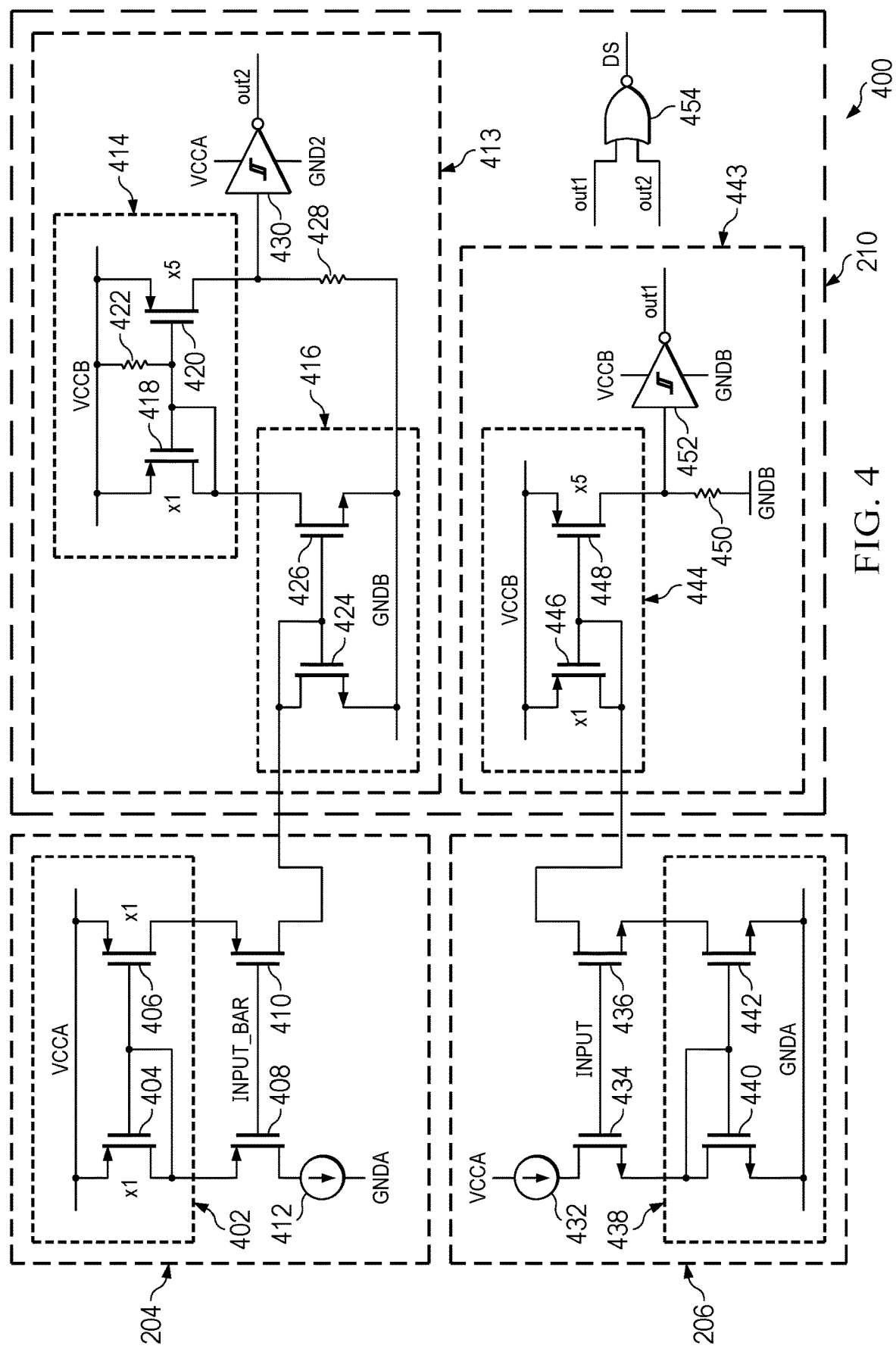
FIG. 4 is a schematic diagram of example circuitry of the low speed data circuit of the level shifter of FIG. 2.

FIG. 4 is a schematic diagram of example circuitry 400 of the low speed data circuit of the level shifter 106. The circuitry 400 includes the source circuit 204, the sink circuit 206, and the detector 210. The source circuit 204 sources current to the detector 210 if GNDA is a higher voltage than GNDB. The sink circuit 206 sinks current from the detector 210 if GNDB is a higher voltage than GNDA. The source circuit 204 includes a current mirror circuit 402, transistors 408 and 410, and a current source 412. The current mirror circuit 402 includes transistors 404 and 406. The transistors 404, 406, 408, and 410 may be p-type field effect transistors (PFETs). A first terminal (e.g., source) of the transistor 404 is coupled to VCCA. A second terminal (e.g., drain) of the transistor 404 is coupled to a control terminal (e.g., gate) of the transistor 404. A first terminal (e.g., source) of the transistor 406 is coupled to VCCA. A control terminal (e.g., gate) of the transistor 406 is coupled to the control terminal of the transistor 404.

A first terminal (e.g., source) of the transistor 408 is coupled to the second terminal of the transistor 404. A second terminal (e.g., drain) of the transistor 408 is coupled to an input of the current source 412. An output of the current source 412 is coupled to GNDA. A control terminal (e.g., gate) of the transistor 408 is coupled to I/P (e.g., through an inverter (not shown)) for receipt of a signal INPUT_BAR, which is an inverted version of the input signal received at I/P. A first terminal (e.g., source) of the transistor 410 is coupled to the second terminal of the transistor 406. A second terminal (e.g., drain) of the transistor 410 is coupled to the detector 210. A control terminal (e.g., gate) of the transistor 410 is coupled to the control terminal of the transistor 408. If the signal INPUT_BAR is a logic low, the transistors 408 and 410 are turned on, and current flows through the transistor 404 and the transistor 408 to the current source 412, and through the transistor 406 and the transistor 410 to the detector 210.

The detector 210 includes circuitry 413 coupled to the source circuit 204. The circuitry 413 includes a current mirror circuit 414, a current mirror circuit 416, a resistor 428, and an inverter 430. The inverter 430 may be Schmidt trigger circuit. An input of the inverter 430 is coupled to the current mirror circuit 414 and an output of the inverter 430 is coupled to an input of a logic gate 454. The current mirror circuit 414 includes transistors 418 and 420, and a resistor 422. The transistor 418 and the transistor 420 may be PFETs. A first terminal (e.g., source) of the transistor 418 is coupled to VCCB. A second terminal (e.g., drain) of the transistor 418 is coupled to a control terminal (e.g., gate) of the transistor 418. A first terminal (e.g., source) of the transistor 420 is coupled to VCCB. A second terminal (e.g., drain) of the transistor 420 is coupled to an input of the inverter 430. A control terminal (e.g., gate) of the transistor 420 is coupled to the control terminal of the transistor 418. The resistor 422 is coupled between VCCB and the control terminal of the transistor 418.

The current mirror circuit 416 includes transistors 424 and 426. The transistor 424 and the transistor 426 may be n-channel field effect transistors (NFETs). A first current terminal (e.g., drain) of the transistor 424 is coupled to the second current terminal of the transistor 410, and to a control terminal (e.g., gate) of the transistor 424. A second current terminal (e.g., source) of the transistor 424 is coupled to GNDB. A first current terminal of the transistor 426 is coupled to the second current terminal of the transistor 418. A second current terminal (e.g., source) of the transistor 426 is coupled to GNDB. A control terminal of the transistor 426 is coupled to the control terminal of the transistor 424. Current flowing through the transistor 410 flows through the transistor 424, and the transistor 426 draws a current mirroring that flowing through the transistor 424 from the transistor 418. As current flows through the transistor 418, current also flows through the transistor 420, and a voltage is dropped across the resistor 428.

The sink circuit 206 includes a current source 432, transistors 434 and 436, and a current mirror circuit 438. The current mirror circuit 438 includes transistors 440 and 442. The transistors 434, 436, 440, and 442 may be NFETs. The transistor 440 has a first terminal (e.g., drain) coupled to a control terminal (e.g., gate) of the transistor 440. A second terminal (e.g., source) of the transistor 440 is coupled to GNDA. A first terminal (e.g., drain) of the transistor 442 is coupled to the transistor 436. A second terminal (e.g., source) of the transistor 442 is coupled to GNDA. A control terminal (e.g., gate) of the transistor 442 is coupled to the control terminal of the transistor 440.

The current source 432 has an input coupled to VCCA and an output coupled to a first terminal (e.g., drain) of the transistor 434. A second terminal (e.g., source) of the transistor 434 is coupled to the first terminal of the transistor 440. A control terminal (e.g., gate) of the transistor 434 is coupled to I/P for receipt of the input signal INPUT. A first terminal (e.g., drain) of the transistor 436 is coupled to the detector 210. A second terminal (e.g., source) of the transistor 436 is coupled to the first terminal of the transistor 442. A control terminal (e.g., gate) of the transistor 436 is coupled to the control terminal of the transistor 434. If INPUT is a logic high, the transistors 434 and 436 turn on, current flows from the current source 432 through the transistor 434 and the transistor 440, and current flows from the detector 210 through the transistor 436 and the transistor 442.

The detector 210 includes circuitry 443 coupled to the sink circuit 206. The circuitry 443 includes a current mirror circuit 444, a resistor 450, and an inverter 452. The inverter 452 may be Schmidt trigger circuit. An input of the inverter 452 is coupled to the current mirror circuit 444 and an output of the inverter 452 is coupled to an input of the logic gate 454. The current mirror circuit 444 includes transistors 446 and 448. The transistor 446 and the transistor 448 may be PFETs. A first terminal (e.g., source) of the transistor 446 is coupled to VCCB. A second terminal (e.g., drain) of the transistor 446 is coupled to a control terminal (e.g., gate) of the transistor 446. A first terminal (e.g., source) of the transistor 448 is coupled to VCCB. A second terminal (e.g., drain) of the transistor 448 is coupled to an input of the inverter 452. A control terminal (e.g., gate) of the transistor 448 is coupled to the control terminal of the transistor 446. Current flowing through the transistor 436 flows through the transistor 446, and the transistor 448 draws a current mirroring that flowing through the transistor 446. The current flowing through the transistor 448 also flows through the resistor 450, and a voltage is developed the resistor 450.

The logic gate 454 logically combines (e.g., logical NOR) OUT1 provided by the inverter 452, and OUT2 provided by the inverter 430, to generate the detector signal DS. The detector signal DS is a representation of the signal received at I/P.

Figure 5:
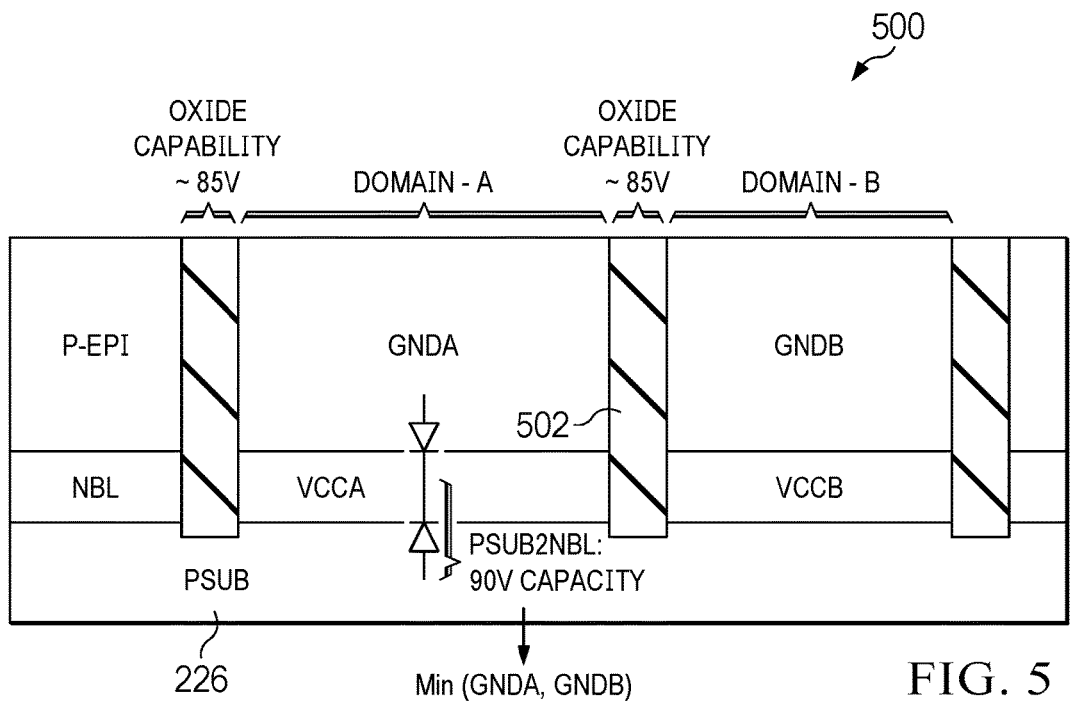
FIG. 5 is a cross-section view of an example integrated circuit that includes the level shifter of FIG. 2.

FIG. 5 is a cross-section view of an integrated circuit 500 that includes the level shifter 106. FIG. 5 shows the semiconductor substrate 226, an N-buried layer (NBL) layer, and a P-epitaxial (P-EPI) layer in the integrated circuit 500. Portions of the P-EPI layer and the NBL layer form DOMAIN-A and DOMAIN-B. The driver circuit 110 may be in DOMAIN-A, and the receiver circuit 112 may be in DOMAIN-B. DOMAIN-A is isolated from DOMAIN-B by an isolation trench 502. The isolation trench 502 may contain an insulator, such as an oxide or other insulation material. In DOMAIN-A, the P-EPI layer may be coupled to GNDA. In DOMAIN-B, the P-EPI layer may be coupled to GNDB. The voltages on GNDA and GNDB may be different. Circuitry of the driver circuit 110 formed in the NBL layer of DOMAIN-A may be coupled to VCCA, and circuitry of the receiver circuit 112 formed in the NBL layer of DOMAIN-B may be coupled to VCCB.

If the voltage between layers of the integrated circuit 500 exceeds a maximum safe voltage, then the integrated circuit 500 may be damaged. For example, if the voltage between the semiconductor substrate 226 and the NBL layer of DOMAIN-A exceeds a maximum safe voltage, then the integrated circuit 500 may be damaged. The substrate bias circuit 216 biases the semiconductor substrate 226 to reduce the inter-layer voltage and reduce the likelihood of damage to the integrated circuit 500.

In the example of FIG. 5, the junctions between the NBL layer and the semiconductor substrate 226, or the P_EPI and NBL layers have a maximum safe voltage of about 90 volts. The substrate bias circuit 216 conducts from the GNDA and GNDB to the semiconductor substrate 226 to prevent the voltage between the semiconductor substrate 226 and GNDA or GNDB from exceeding about 90 volts. For example, the substrate bias circuit 216 may conduct current between the substrate bias circuit 216 and GNDA or GNDB if the inter-layer voltage exceeds about 50 volts.

Figure 6:
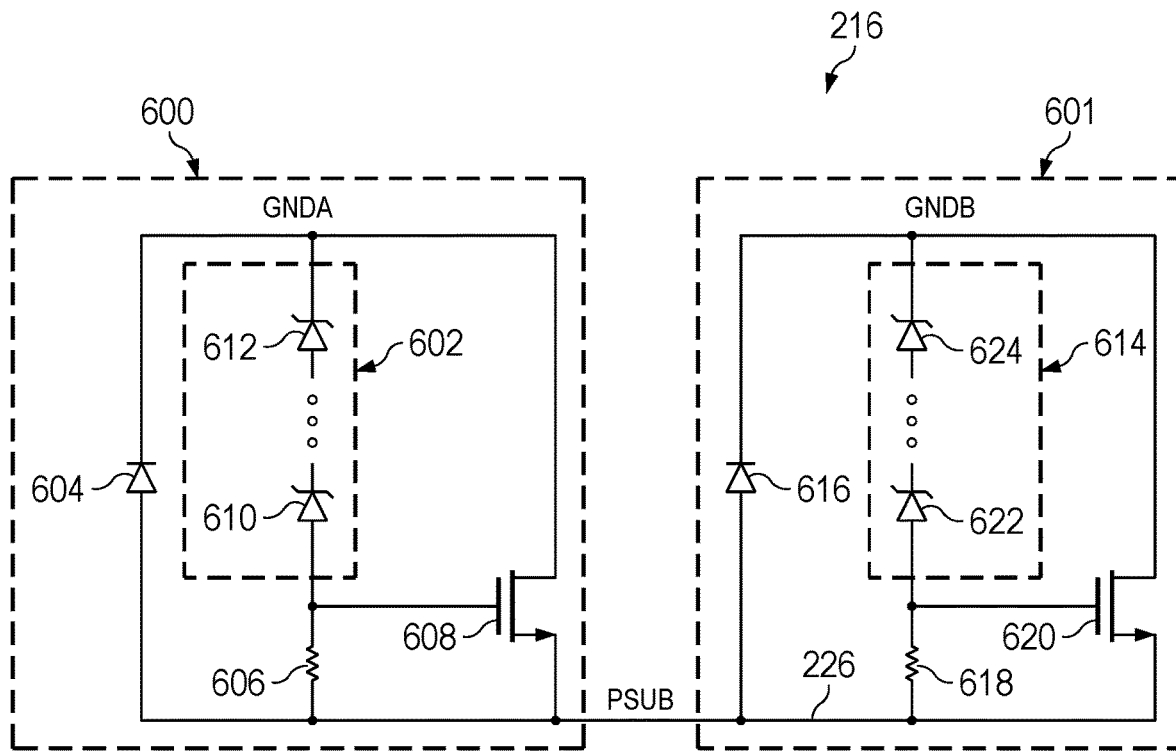
FIG. 6 is a schematic diagram of an example substrate bias circuit of the level shifter of FIG. 2.

FIG. 6 is a schematic diagram of an example substrate bias circuit 216. The substrate bias circuit 216 includes a bias circuit 600 coupled between GNDA and the semiconductor substrate 226, and a bias circuit 601 coupled between GNDB and the semiconductor substrate 226. The bias circuit 600 includes Zener diodes 602, which includes one or more Zener diodes coupled in series, a resistor 606, a transistor 608, and a diode 604. In FIG. 6, the Zener diodes 602 includes Zener diodes 610 and Zener diode 612 coupled in series. A cathode of the Zener diode 612 is coupled to GNDA. An anode of the Zener diode 612 is coupled to the cathode of the Zener diode 610. Examples of the Zener diodes 602 may include any number of Zener diodes coupled in series to provide a desired reverse breakdown voltage.

The resistor 606 is coupled between the Zener diodes 602 and the semiconductor substrate 226. A first terminal of the resistor 606 is coupled to the anode of the Zener diode 610, and a second terminal of the resistor 606 is coupled to the semiconductor substrate 226. The transistor 608 has a first terminal (e.g., drain) coupled to GNDA, and a second terminal (e.g., source) coupled to the semiconductor substrate 226. A control terminal (e.g., gate) of the transistor 608 is coupled to the first terminal of the resistor 606. If the voltage between GNDA and the semiconductor substrate 226 exceeds the threshold set by the reverse breakdown voltage of the Zener diodes 602 (the voltage on GNDA exceeds the voltage on the semiconductor substrate 226 by the reverse breakdown voltage of the Zener diodes 602), the Zener diodes 602 conduct current and a voltage is developed across the resistor 606. The voltage across the resistor 606 turns on the transistor 608, and current flows from GNDA to the semiconductor substrate 226 to reduce the difference in voltage between GNDA and the semiconductor substrate 226.

The diode 604 is coupled between GNDA and the semiconductor substrate 226. A cathode of the diode 604 is coupled to GNDA, and an anode of the diode 604 is coupled to the semiconductor substrate 226. If the voltage on the semiconductor substrate 226 is higher than the voltage on GNDA, then the diode 604 conducts current from the semiconductor substrate 226 to GNDA to reduce the difference in voltage.

The bias circuit 601 is similar to the bias circuit 600. The bias circuit 601 includes Zener diodes 614, which includes one or more Zener diodes coupled in series, a resistor 618, a transistor 620, and a diode 616. In FIG. 6, the Zener diodes 614 includes Zener diodes 622 and 624 coupled in series. A cathode of the Zener diode 624 is coupled to GNDB. An anode of the Zener diode 624 is coupled to the cathode of the Zener diode 622. Examples of the Zener diodes 614 may include any number of Zener diodes coupled in series to provide a desired reverse breakdown voltage.

The resistor 618 is coupled between the Zener diodes 614 and the semiconductor substrate 226. A first terminal of the resistor 618 is coupled to the anode of the Zener diode 622, and a second terminal of the resistor 618 is coupled to the semiconductor substrate 226. The transistor 620 has a first terminal (e.g., drain) coupled to GNDB, and a second terminal (e.g., source) coupled to the semiconductor substrate 226. A control terminal (e.g., gate) of the transistor 620 is coupled to the first terminal of the resistor 618. If the voltage between GNDB and the semiconductor substrate 226 exceeds the reverse breakdown voltage of the Zener diodes 614 (the voltage on GNDB exceeds the voltage on the semiconductor substrate 226 by the reverse breakdown voltage of the Zener diodes 614), the Zener diodes 614 conduct current and a voltage is developed across the resistor 618. The voltage across the resistor 618 turns on the transistor 620, and current flows through the transistor 620 from GNDB to the semiconductor substrate 226 to reduce the difference in voltage between GNDB and the semiconductor substrate 226.

The diode 616 is coupled between GNDB and the semiconductor substrate 226. A cathode of the diode 616 is coupled to GNDB, and an anode of the diode 616 is coupled to the semiconductor substrate 226. If the voltage on the semiconductor substrate 226 is higher than the voltage on GNDB, then the diode 616 conducts current from the semiconductor substrate 226 to GNDB to reduce the difference in voltage.

Figure 7:
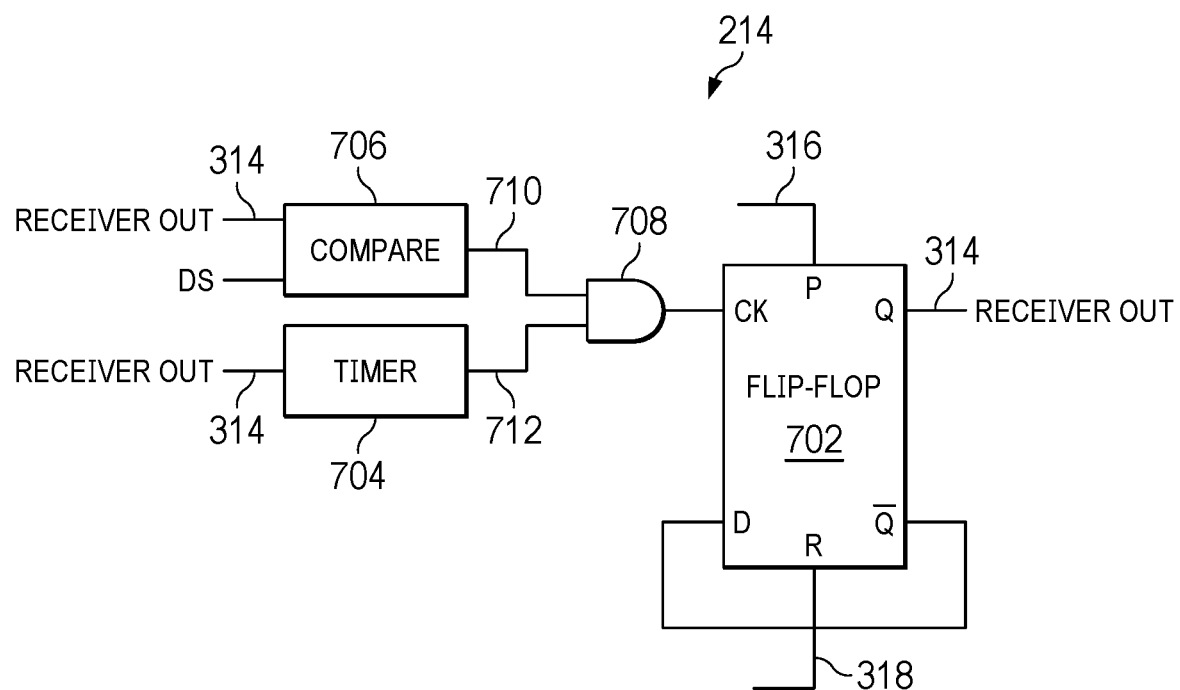
FIG. 7 is a block diagram of an example logic circuit of the level shifter shown in FIG. 2.

FIG. 7 is a block diagram of an example logic circuit 214. The logic circuit 214 includes a flip-flop 702, a timer circuit 704, a compare circuit 706, and a logic gate 708. The flip-flop 702 has a preset input coupled to the first output of the differential amplifier 308 for receipt of the signal 316, and a reset input coupled to the second output of the differential amplifier 308 for receipt of the signal 318. Pulses on the signal 316 set the receiver out signal 314 provided at the Q output of the flip-flop 702 to a logic high. Pulses on the signal 318 set the receiver out signal 314 provided at the Q output of the flip-flop 702 to a logic low. A D input of the flip-flop 702 is coupled to a Qbar output of the flip-flop 702 to provide the inverse of the receiver out signal 314 at the D input.

The flip-flop 702, timer circuit 704, compare circuit 706, and logic gate 708 ensure that errors in the state of the receiver out signal 314 (e.g., errors caused by noise at the inputs of the differential amplifier 306) are corrected based on the detector signal DS. The timer circuit 704 has an input coupled to the Q output of the flip-flop 702. A change in state of the receiver out signal 314 triggers the timer circuit 704. For example, a low-to-high or high-to-low transition of the receiver out signal 314 may trigger the timer circuit 704. When triggered by a transition on the receiver out signal 314, the timer circuit 704 generates a transition on the timer output signal 712 after a predetermined time. For example, a transition on the receiver out signal 314 may reset the timer circuit 704, and predetermined time later (e.g., 1 microsecond later), the timer circuit 704 may provide a pulse on the timer output signal 712.

The compare circuit 706 compares the receiver out signal 314 to the detector signal DS provided by the detector 210. The compare circuit 706 provides a signal 710 that indicates whether the receiver out signal 314 and DS have a same logic state (e.g., both are logic high or both are logic low). For example, the compare circuit 706 may provide the signal 710 in a logic high state if DS and the receiver out signal 314 have different logic states (e.g., DS is a logic high, and the receiver out signal 314 is a logic low). In some examples the compare circuit 706 may include an exclusive-OR gate to compare the receiver out signal 314 and the DS.

The logic gate 708 has a first input coupled to an output of the compare circuit 706 and a second input coupled to the output of the timer circuit 704. If the signal 710 is a logic high (indicating the logic states of DS and the receiver out signal 314 are different), and a pulse is present on the timer output signal 712, the flip-flop 702 is clocked and the receiver out signal 314 is inverted. Accordingly, the state of the receiver out signal 314 is changed to match that state of DS. The logic gate 708 may be an AND gate.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

As used herein, the terms "terminal," "node," "interconnection," "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead with little or no change to the remaining circuitry. For example, a field effect transistor ("FET") (such as an n-channel FET (NFET) (n-type transistor) or a p-channel FET (PFET)) (p-type transistor)), a bipolar junction transistor (BJT-e.g., NPN transistor or PNP transistor), an insulated gate bipolar transistor (IGBT), and/or a junction field effect transistor (JFET) may be used in place of or in conjunction with the devices described herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input (or transistor control terminal) is the gate, and the current terminals are the drain and source. In the context of a BJT, the control input is the base, and the current terminals are the collector and emitter.

References herein to a FET being "ON" means that the conduction channel of the FET is present and drain current may flow through the FET. References herein to a FET being "OFF" means that the conduction channel is not present so drain current does not flow through the FET. An "OFF" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A circuit comprising:
a semiconductor substrate;
a first ground terminal;
a second ground terminal;
a driver circuit on the semiconductor substrate, the driver circuit coupled to the first ground terminal, and having a first output and a second output;
a capacitor having a first terminal coupled to the first output of the driver circuit and a second terminal;
a receiver circuit on the semiconductor substrate, the receiver circuit coupled to the second ground terminal, and having a first input coupled to the second terminal of the capacitor, and a second input coupled to the second output of the driver circuit; and
a substrate bias circuit having a first input coupled to the first ground terminal, a second input coupled to the second ground terminal, and an output coupled to the semiconductor substrate.

2. The circuit of claim 1, wherein the substrate bias circuit is configured to provide, to the semiconductor substrate, a bias voltage selected to be a lower of a voltage of the first ground terminal and a voltage of the second ground terminal.

3. The circuit of claim 1, wherein:
the capacitor is a first capacitor;
the driver circuit includes a transmitter having an input, a first output and a second output;
the receiver circuit includes a pulse receiver having a first input, a second input, and an output,
the first terminal of the first capacitor is coupled to the first output of the transmitter and the second terminal of the first capacitor is coupled to the first input of the pulse receiver; and
the circuit includes a second capacitor having a first terminal coupled to the second output of the transmitter and a second terminal coupled to the second input of the pulse receiver.

4. The circuit of claim 3, wherein the pulse receiver includes a differential amplifier having a first input coupled to the first input of the pulse receiver, a second input coupled to the second input of the pulse receiver, and an output coupled to the output of the pulse receiver.

5. The circuit of claim 3, wherein the receiver circuit includes a logic circuit having an input coupled to the output of the pulse receiver, and an output, the logic circuit configured to generate, at the output of logic circuit, an output signal having a first state responsive to a pulse having a first polarity received from the pulse receiver, and having a second state responsive to a pulse having a second polarity received from the pulse receiver.

6. The circuit of claim 5, wherein the receiver circuit includes a level shifter circuit coupled to the output of the logic circuit.

7. The circuit of claim 5, wherein:
the driver circuit includes:
a source circuit having an input coupled to the input of the transmitter, and an output;
a sink circuit having an input coupled to the input of the transmitter, and an output; and
the receiver circuit includes a detector having a first input coupled to the output of the source circuit, a second input coupled to the output of the sink circuit, and an output, the detector configured to provide a detector signal based on a source signal received from the source circuit and a sink signal received from the sink circuit.

8. The circuit of claim 7, wherein the logic circuit has an override input coupled to the output of the detector, and the logic circuit is configured to change a state of the output signal based on the state of the output signal differing from a state of the detector signal.

9. A circuit comprising:
a semiconductor substrate;
a first ground terminal;
a second ground terminal;
a driver circuit coupled to the first ground terminal, the driver circuit including a transmitter having a first output and a second output;
a receiver circuit coupled to the second ground terminal, the receiver circuit including a pulse receiver having a first input and a second input;
a first capacitor having a first terminal coupled to the first output of the transmitter and a second terminal coupled to the first input of the pulse receiver; and
a second capacitor having a first terminal coupled to the second output of the transmitter and a second terminal coupled to the second input of the pulse receiver; and
a substrate bias circuit having a first input coupled to the first ground terminal, a second input coupled to the second ground terminal, and an output coupled to the semiconductor substrate.

10. The circuit of claim 9, wherein the substrate bias circuit is configured to provide, to the semiconductor substrate, a bias voltage selected to be a lower of a ground voltage of the first ground terminal and a ground voltage of the second ground terminal.

11. The circuit of claim 9, wherein the substrate bias circuit is configured to:
conduct current from the first ground terminal to the semiconductor substrate responsive to a voltage between the semiconductor substrate and the first ground terminal exceeding a threshold; and
conduct current from the second ground terminal to the semiconductor substrate responsive to a voltage between the semiconductor substrate and the second ground terminal exceeding the threshold.

12. The circuit of claim 9, wherein the pulse receiver includes a differential amplifier having a first input coupled to the first input of the pulse receiver, a second input coupled to the second input of the pulse receiver, and an output coupled to the output of the pulse receiver.

13. The circuit of claim 12, wherein the receiver circuit includes a logic circuit having an input coupled to the output of the differential amplifier, and an output, the logic circuit configured to generate, at the output of logic circuit, an output signal having a first state responsive to pulses having a first polarity received from the differential amplifier, and having a second state responsive to pulses having a second polarity received from the differential amplifier.

14. The circuit of claim 13, wherein the receiver circuit includes a level shifter circuit coupled to the output of the logic circuit.

15. The circuit of claim 13, wherein:
the driver circuit includes:
 a source circuit having an input coupled to the input of the transmitter, and an output;
 a sink circuit having an input coupled to the input of the transmitter, and an output; and
the receiver circuit includes a detector having a first input coupled to the output of the source circuit, a second input coupled to the output of the sink circuit, and an output, the detector configured to provide a detector signal based on a source signal received from the source signal received from the source circuit and a sink signal received from the sink circuit.

16. The circuit of claim 15, wherein the logic circuit has an override input coupled to the output of the detector, and the logic circuit is configured to change a state of the output signal based on the state of the output signal differing from a state of the detector signal.

17. A system comprising:
a first ground terminal and a second ground terminal;
a first circuit coupled to the first ground terminal, the first circuit having an output for providing an output signal;
a second circuit coupled to the second ground terminal, the second circuit having an input;
a level shifter integrated circuit having an input coupled to the output of the first circuit, and an output coupled to the input of the second circuit, the level shifter integrated circuit including:
 a semiconductor substrate;
 a driver circuit on the semiconductor substrate, the driver circuit coupled to the first ground terminal, and having an input coupled to the input of the level shifter integrated circuit, a first output and a second output;
 a capacitor having a first terminal coupled to the first output of the driver circuit and a second terminal;
 a receiver circuit on the semiconductor substrate, the receiver circuit coupled to the second ground terminal, and having a first input coupled to the second terminal of the capacitor, a second input coupled to the second output of the driver circuit, and an output coupled to the output of the level shifter integrated circuit; and
 a substrate bias circuit having a first input coupled to the first ground terminal, a second input coupled to the second ground terminal, and an output coupled to the semiconductor substrate.

18. The system of claim 17, wherein the substrate bias circuit is configured to provide, to the semiconductor substrate, a bias voltage selected to be a lower of a ground voltage of the first ground terminal and a ground voltage of the second ground terminal.

19. The system of claim 17, wherein:
the capacitor is a first capacitor;
the level shifter integrated circuit includes a second capacitor;
the driver circuit includes a transmitter having an input coupled to the input of the driver circuit, a first output and a second output;
the receiver circuit includes:
 a differential amplifier having a first input coupled to the first output of the transmitter through the first capacitor, a second input coupled to the second output of the transmitter through the second capacitor, and an output; and
 a logic circuit having an input coupled to the output of the differential amplifier, and an output coupled to the output of the receiver circuit, the logic circuit configured to configured to generate, at the output of logic circuit, an output signal having a first state responsive to pulses having a first polarity received from the differential amplifier, and having a second state responsive to pulses having a second polarity received from the differential amplifier.

20. The system of claim 19, wherein:
the driver circuit includes:
 a source circuit having an input coupled to the input of the transmitter, and an output;
 a sink circuit having an input coupled to the input of the transmitter, and an output; and
the receiver circuit includes a detector having a first input coupled to the output of the source circuit, a second input coupled to the output of the sink circuit, and an output, the detector configured to provide a detector signal based on a source signal received from the source signal received from the source circuit and a sink signal received from the sink circuit; and
the logic circuit has an override input coupled to the output of the detector, and the logic circuit is configured to change a state of the output signal based on the state of the output signal differing from a state of the detector signal.

* * * * *